US008093906B2

(12) United States Patent
Lindsey (10) Patent No.: US 8,093,906 B2
(45) Date of Patent: Jan. 10, 2012

(54) SYSTEM AND METHOD FOR TESTING WINDING INSULATION RESISTANCE

(75) Inventor: Robert Wayne Lindsey, Washington, IL (US)

(73) Assignee: Caterpillar, Inc., Peoria, IL (US)

( * ) Notice: Subject to any disclaimer, the term of this patent is extended or adjusted under 35 U.S.C. 154(b) by 548 days.

(21) Appl. No.: 12/078,636

(22) Filed: Apr. 2, 2008

(65) Prior Publication Data

US 2009/0251154 A1 Oct. 8, 2009

(51) Int. Cl.
*H01H 31/12* (2006.01)
(52) U.S. Cl. ......................................... 324/551; 324/546
(58) Field of Classification Search ................... 324/551
See application file for complete search history.

(56) References Cited

U.S. PATENT DOCUMENTS

| 4,766,387 | A | 8/1988 | Browne et al. |
| 4,896,115 | A | 1/1990 | LeMaitre et al. |
| 5,117,191 | A | 5/1992 | Saigo et al. |
| 5,243,243 | A | 9/1993 | Andrews |
| 5,471,144 | A | 11/1995 | Meyer |
| 7,005,860 | B2 | 2/2006 | Yamamoto et al. |
| 7,012,435 | B2 | 3/2006 | Yamamoto et al. |
| 7,030,621 | B2 | 4/2006 | Sarkozi et al. |
| 7,034,706 | B1 | 4/2006 | Nippes |
| 7,256,701 | B2 | 8/2007 | Kono et al. |
| 7,285,961 | B2 | 10/2007 | Shinmoto et al. |

OTHER PUBLICATIONS

Kuphaldt, Tony. Lessons in Electric Circuits, vol. II—AC, sixth edition, 2007, Design Science, p. 19-23.*
Lindsey et al., U.S. Appl. No. 11/882,242, filed Jul. 31, 2007.

* cited by examiner

*Primary Examiner* — Thomas Valone
(74) *Attorney, Agent, or Firm* — Finnegan, Henderson, Farabow, Garrett & Dunner LLP (57) ABSTRACT

A power electronics system configured to determine a condition of a winding insulation is disclosed. The system may include at least one capacitor, and a first resistance coupled to the at least one capacitor. The system may further include a plurality of electronic switching devices coupled to at least the first resistance and the at least one capacitor, wherein the plurality of electronic switching devices are configured to selectively couple the at least one capacitor to a power source to charge the at least one capacitor during a first time interval and selectively couple the at least one capacitor to a second resistance during a second time interval. The system may further include a voltage measuring device configured to detect a change in voltage at a terminal of the at least one capacitor in response to the selective coupling of the at least one capacitor to the second resistance. The system may further include a computing system configured to determine a condition of the insulation based on the detection.

18 Claims, 5 Drawing Sheets

SYSTEM AND METHOD FOR TESTING WINDING INSULATION RESISTANCE

TECHNICAL FIELD

The present disclosure relates generally to a system and method for testing insulation that surrounds an electric conductor, and more particularly, to a system and method for testing winding insulation resistance in an electric powertrain.

BACKGROUND

The use of electric motors is becoming increasingly popular in powertrain systems due, in large part, to their relatively high efficiency, responsiveness, and environmental cleanliness when compared with conventional powertrain systems that rely solely on internal combustion engine drive technology. In order to generate electric fields large enough to produce the relatively high output torque required of modern powertrain systems, these electric motors may be subjected to extremely high current levels. If not properly isolated and contained, current may be allowed to "leak" into other electrical circuits or systems, potentially decreasing motor and, ultimately, powertrain performance. If undetected, current leakage may cause serious damage to sensitive electronics and electric systems associated with a machine.

One common cause of a breach of electrical isolation, potentially leading to current leakage, may be a deterioration in insulation that surrounds the phase windings in the electric motor. Such deterioration may lead to breakdown in isolation between electric phases and/or between one or more phases and ground, potentially resulting in a short-circuit condition that may cause, for example, an arc-fault. Consequently, an accurate system and method for detecting deterioration in conductor insulation may be required.

Some systems and methods for determining the structural integrity of winding insulation in an electric powertrain may require the dismantling of the powertrain in order to test the resistance of the winding insulation. Such manual methods may increase maintenance costs and require significant machine downtime. Thus, accurately detecting insulation wear in an electric machine, while minimizing repair costs and machine downtime, may also be required.

One system for accurately determining the structural integrity of motor winding insulation, while reducing downtime and maintenance costs, is set forth in U.S. Pat. No. 4,766,387 (the '387 patent) issued to Browne et al. The '387 patent discloses a system for measuring the insulation resistance of a winding of a polyphase motor. The system includes a motor winding insulation resistance measuring circuit and a switching mechanism that allows for each motor winding to be coupled to a separate phase power source and the circuit. The insulation measuring circuit is then used to measure the resistance of a winding's insulation to ground while the motor is operating.

Because the '387 patent may provide a solution for determining a breach in the structural integrity of winding insulators during operation of the motor without requiring dismantling and manual inspection/testing of each insulator, it may limit machine downtime and maintenance costs associated with manual inspection techniques in certain situations. However, the complexity and customized nature of the system disclosed in the '387 patent, as well as the process of connecting the circuit to the motor, may make the system difficult to operate.

The disclosed system and method is directed to overcoming one or more of the shortcomings set forth above.

SUMMARY

An aspect of the present disclosure is directed to a power electronics system configured to determine a condition of a winding insulation. The system may include at least one capacitor, and a first resistance coupled to the at least one capacitor. The system may further include a plurality of electronic switching devices coupled to at least the first resistance and the at least one capacitor, wherein the plurality of electronic switching devices are configured to selectively couple the at least one capacitor to a power source to charge the at least one capacitor during a first time interval and selectively couple the at least one capacitor to a second resistance during a second time interval. The system may further include a voltage measuring device configured to detect a change in voltage at a terminal of the at least one capacitor in response to the selective coupling of the at least one capacitor to the second resistance. The system may further include a computing system configured to determine a condition of the insulation based on the detection.

Another aspect of the present disclosure is directed to a method for determining a condition of a winding insulation. The method may include discharging at least one capacitor. The method may further include selectively coupling the at least one capacitor to a resistance while the at least one capacitor is discharging. The method may further include detecting a change in voltage at a terminal of the at least one capacitor in response to the coupling of the at least one capacitor to the resistance. The method may further include determining, based on the detection, a condition of the winding insulation.

DETAILED DESCRIPTION

Figure 1:
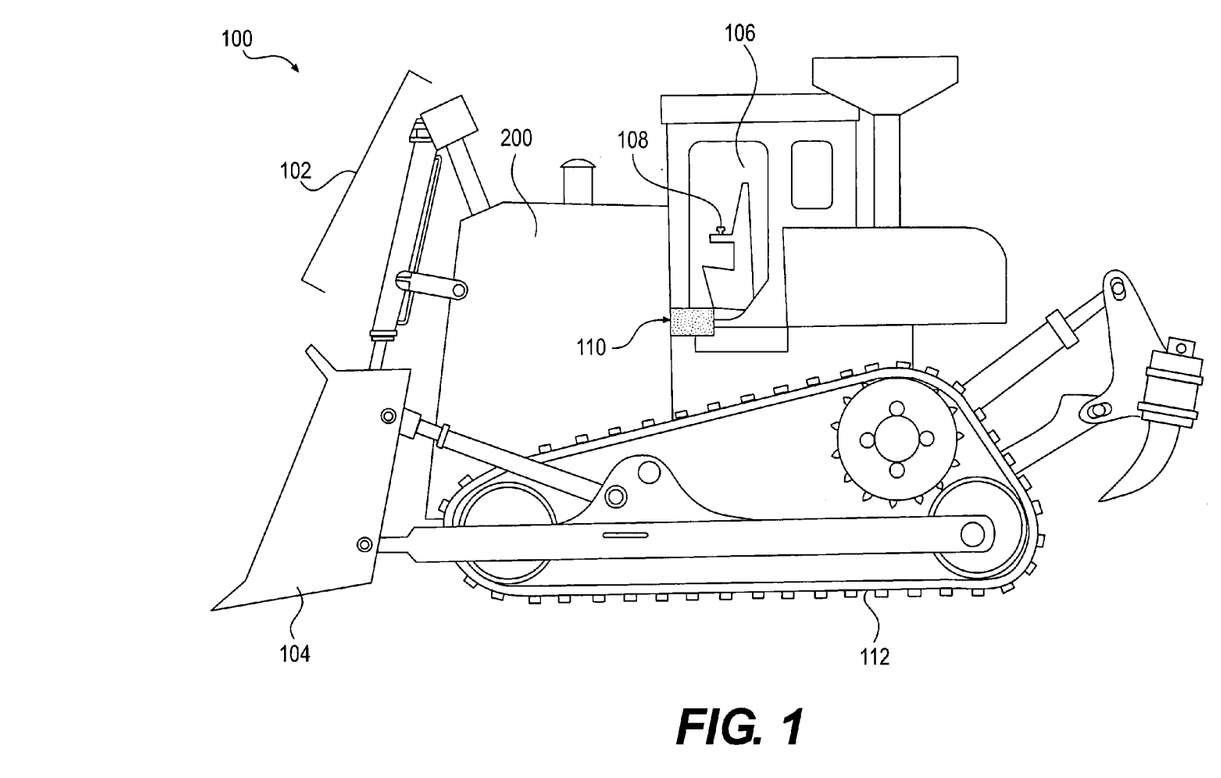
FIG. 1 is a diagrammatic illustration of an exemplary disclosed machine.

FIG. 1 illustrates an exemplary machine 100. Machine 100 may be a mobile machine that performs some type of operation associated with an industry such as mining, construction, farming, transportation, or any other industry known in the art. For example, machine 100 may be an earth moving machine such as an excavator, a dozer, a loader, a backhoe, a motor grader, or any other earth moving machine. It is contemplated that machine 100 may embody a machine different than that illustrated in FIG. 1. For example, machine 100 may be an on-highway or off-highway vehicle such as a haul truck, a rail transport vehicle, a mobile rail car mover, or any other type of machine.

Machine 100 may include a linkage system 102, a tool 104 attachable to linkage system 102, and an operator interface 106. Operator interface 106 may be configured to receive input from a machine operator indicative of a desired movement of machine 100. Specifically, operator interface 106 may include an operator interface device 108 and an electronic control module 110. In one embodiment, operator interface device 108 may be a multi-axis joystick located to one side of an operator station. Operator interface device 108 may be a proportional-type controller configured to position and/or manipulate linkage system 102 and/or tool 104 by producing and directing an interface device position signal to electronic control module 110. The interface device position signal may be indicative of a desired movement of tool 104. It is contemplated that additional and/or different operator interface devices may be included within operator interface 106 such as, for example, wheels, knobs, push-pull devices, switches, pedals, and/or other such operator interface devices.

Electronic control module 110 may be a computing system that include one or more components configured to perform system controls such as, for example, a memory, a secondary storage device, and a processor. One skilled in the art will appreciate that electronic control module 110 may contain additional and/or different components than those listed above. For example, electronic control module 110 may include one or more other components or subsystems such as, for example, power supply circuitry, signal conditioning circuitry, solenoid driver circuitry, and/or any other suitable circuit for aiding in the control of one or more systems of machine 100.

Machine 100 may further include a traction device 112 and an electric powertrain system 200. Traction device 112 may include one or more ground-engaging devices for maneuvering, moving, or otherwise positioning machine 100 to facilitate the performance of one or more tasks associated with machine 100. Traction device 112 may include, for example, tracks, wheels, belts, or any other suitable device that facilitate maneuvering and movement of machine 100.

Electric powertrain system 200 may include one or more components and subsystems that cooperate to perform one or more operations associated with machine 100. More specifically, electric powertrain system 200 may include electrical, mechanical, and electro-mechanical components associated with an electrical drivetrain system of machine 100. Additionally, according to exemplary embodiments described herein, electric powertrain system 200 may be configured to monitor operational parameters associated with the electrical components of electric powertrain system 200 and identify certain conditions that may be indicative of excessive wear and/or degradation of the structural integrity associated with the insulation that surrounds conductors of the electric components.

Figure 2:
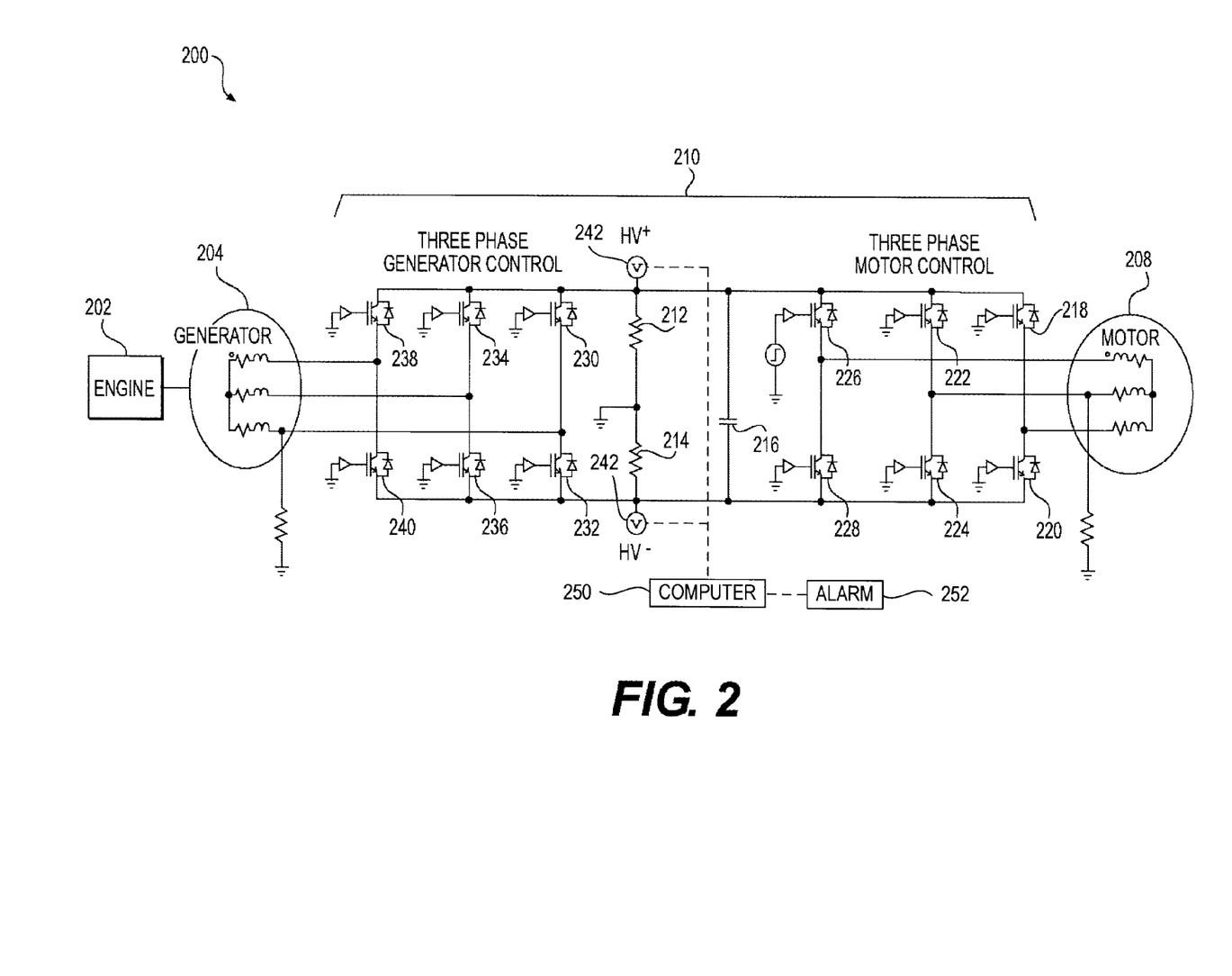
FIG. 2 is a diagrammatic illustration of an exemplary electrical powertrain for the machine of FIG. 1.

FIG. 2 illustrates an exemplary electric powertrain system 200 consistent with the present disclosure. Electric powertrain system 200 may include at least one engine 202, at least one generator 204, at least one motor 208, and at least one power electronics (PE) module 210. PE module 210 may contain a resistor 212, a resistor 214, a capacitor 216, and a plurality of electronic switching devices (ESD) electrically coupling generator 204 and motor 208. The plurality of ESDs located within PE module 210 may include ESD 218, ESD 220, ESD 222, ESD 224, ESD 226, ESD 228, ESD 230, ESD 232, ESD 234, ESD 236, ESD 238, and ESD 240, collectively referred to herein as ESDs 218-240. It is contemplated that PE module 210 may contain additional and/or different components than those listed above. For example, PE module 210 may further contain an additional resistor in parallel with capacitor 216. The additional resistor may be configured to assist in the discharging of capacitor 216 when PE module 210 is turned off.

Engine 202 may be any device configured to output mechanical energy. In one example, engine 202 may be an internal combustion engine having multiple subsystems (not shown) that cooperate to produce a mechanical power output. One skilled in the art will recognize that engine 202 may be any type of internal combustion engine such as, for example, a gasoline or diesel-powered engine. The subsystems included within engine 202 may include, for example, a fuel system (not shown), an air induction system (not shown), an exhaust system (not shown), a lubrication system (not shown), a cooling system (not shown), and/or any other appropriate system(s). Engine 202 may be coupled to generator 204 via a shaft (not shown) and may be configured to provide mechanical energy to generator 204.

Generator 204 may embody any device that is configured to receive mechanical power from engine 202 and convert at least a portion of the mechanical power into electrical energy. For example, generator 204 may convert a torque provided by a rotating shaft associated with engine 202 to rotate one or more coils of wire (i.e., windings) within a magnetic field, thereby inducing a current in the coil. Generator 204 may include, for example, an alternating current synchronous generator, an induction generator, a permanent-magnet generator, a switched-reluctance generator, or any other generator capable of converting mechanical power into electrical power. It is contemplated that engine 202 and generator 204 may be replaced by a single device or multiple devices that can output electrical energy (e.g., batteries, fuel cells, hybrid engines, etc).

Motor 208 may include multiple components that interact to convert electrical energy to mechanical energy. For example, motor 208 may include an output shaft (not shown), and, as electrical power is supplied from generator 204 to motor 208 via PE module 210, motor 208 may generate a torque, which may be delivered to one or more components of machine 100 through the output shaft. The output shaft may be coupled to traction device 112 of machine 100 to deliver torque generated by the motor 208 to traction device 112 to propel machine 100. PE module 210 may be an electronic device configured to convert, condition, and/or regulate the production, and/or flow of electrical power in electric powertrain system 200. For example, PE module 210 may convert and regulate the production and/or flow of electrical power in electric powertrain system 200 by being configured to receive an input of fixed or variable frequency alternating current (AC) from generator 204 and output a fixed or variable frequency AC and/or direct current (DC) from the AC input. PE module 210 may power condition the flow of an electrical current from generator 204 by ensuring the electrical current is balanced, appropriately-phased, and sinusoidal.

ESDs 218-240 may be configured to allow the flow of electrical current from generator 204 to motor 208 via PE module 210. For example, if all of ESDs 218-240 are open, no current will flow from generator 204 to motor 208 via PE module 210. However, if an appropriate number of ESDs 218-240 are closed (e.g., ESD 226 and ESD 224), electrical current may flow to motor 208 via PE module 210, thereby allowing motor 208 to produce a mechanical power output in response to the electrical current input.

ESDs 218-240 may comprise any device, or combination of devices, configured to operate as an electrically-controlled switch. For example, ESDs 218-240 may comprise transistors and diodes. The transistors may include one or more transistors such as, for example, bipolar junction transistors and/or filed-effect transistors.

Resistors 212, 214 may each comprise a resistive material that controls electrical current in PE module 210 by being configured to produce a voltage drop across their respective resistance. Resistors 212, 214 may have any desired resistance. For example, it is contemplated that resistors 212, 214 may both have a resistance value of 1 megohm.

Capacitor 216 may be an electronic device that stores energy in an electric field between a plurality of conductors. For example, capacitor 216 may comprise any one of, or a combination of, metalized paper capacitors, PET film or mylar film capacitors, polystyrene capacitors, metalized mica or silver mica capacitors, class-II high dielectric strength type ceramic capacitors, aluminum electrolytic capacitors, and/or any other suitable capacitor. Capacitor 216 may have any desired capacitance such as, for example, 5000 µF.

As stated previously, electric powertrain system 200 may be configured to determine the structural integrity of winding insulation located within generator 204 and/or motor 208. For example, it is contemplated that a maintenance computer 250 and an alarm 252 (FIG. 2) may be coupled to machine 100. The maintenance computer 250 may be used to initiate a winding insulation resistance test procedure that results in engine 202 and generator 204 being used to produce a voltage across capacitor 216 (i.e., charge capacitor 216). It is further contemplated that a voltage measuring device 242 may be electrically coupled to capacitor 216. The maintenance computer 250 may use the voltage measuring device 242 to measure the voltage across the terminals of capacitor 216.

When all of ESDs 218-240 are open (i.e., no current is allowed to flow from generator 204 to motor 208 via PE module 210), capacitor 216 may discharge at a first rate $\tau$=RC, where R corresponds to the resistance of resistor 212 and resistor 214, and C corresponds to the capacitance of capacitor 216.

At any time during the discharge of capacitor 216, one of ESDs 218-228 may be closed, thus allowing electrical current to flow from PE module 210 to motor 208. The electrical current flowing from PE module 210 to motor 208 may force capacitor 216 to discharge at a second rate $\tau_2$=$R_{new}$C, where C corresponds to the capacitance of capacitor 216, and, if ESD 226 is closed, $R_{new}$ corresponds to the resistance of resistor 212, resistor 214, and the resistance of the winding insulation located within motor 208.

Since dirt, moisture, physical abrasions, etc. may lower the resistance of the winding insulation, the change in discharge rate of capacitor 216, and/or the value of $\tau_2$, when one of ESDs 218-228 is closed, may be used to determine the structural integrity of the winding insulation within motor 208.

Figure 3A:
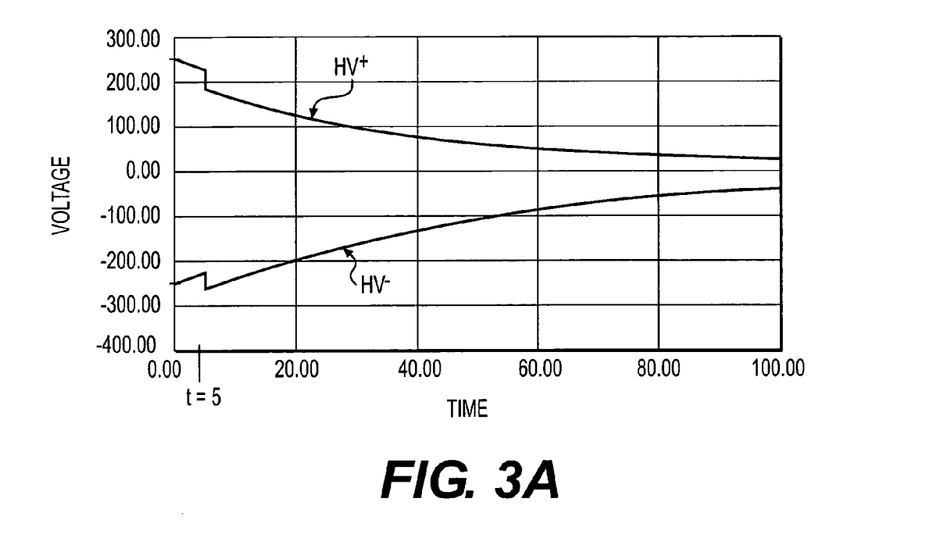
FIG. 3A is an exemplary plot illustrating a discharge rate of a capacitor corresponding to a first winding insulation resistance.

For example, FIG. 3A illustrates an exemplary plot of a voltage versus time discharge rate of capacitor 216 when resistor 212 has a resistance value of 1 megohm, resistor 214 has a resistance value of 1 megohm, and the winding insulation within motor 208 has a resistance value of 2 megohms. As illustrated in FIG. 3A, at t=0, the voltage drop across capacitor 216 is approximately 500 volts (i.e., HV$^+$ is positive 250 volts and HV$^-$ is negative 250 volts). After t=0 all of ESDs 218-240 are opened and no electrical current is allowed to flow from generator 204 to motor 208. Between t=0 and t=5 capacitor 216 has a discharge rate corresponding to the capacitance of capacitor 216 and the resistance of resistors 212, 214. At t=5 ESD 226 may be closed, thus allowing electrical current to flow from PE module 210 to motor 208.

As illustrated in FIG. 3A, a substantially instantaneous change in voltage occurs corresponding to ESD 226 being closed at t=5. The substantially instantaneous change in voltage occurring at t=5 (i.e., when ESD 226 is closed) is a result of at least the winding insulation resistance of motor 208 being placed in parallel with resistor 212. FIG. 3A illustrates that if the winding insulation resistance for motor 208 is 2 megohms, the substantially instantaneous change in voltage at HV$^+$ and HV$^-$, corresponding to closing ESD 226, may be approximately 50 volts.

Figure 3B:
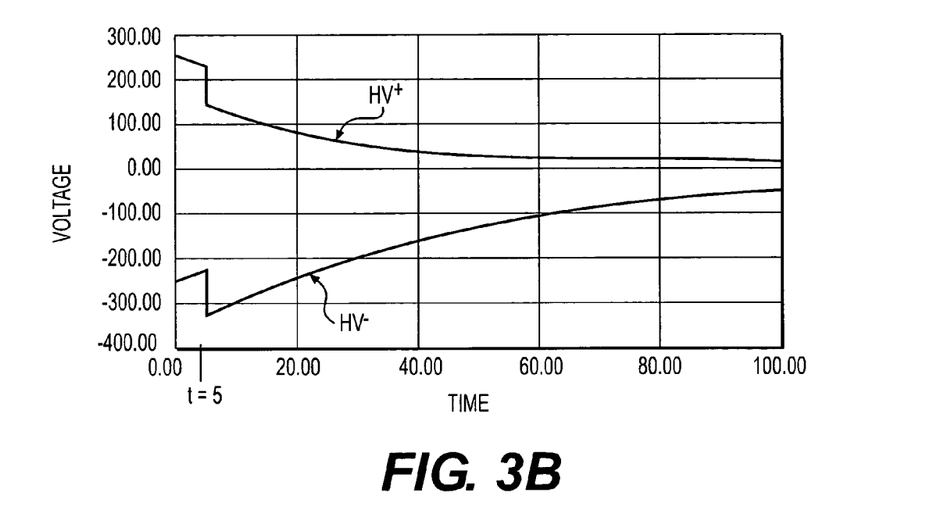
FIG. 3B is an exemplary plot illustrating a discharge rate of a capacitor corresponding to a second winding insulation resistance.

FIG. 3B illustrates a similar set of circumstances as in FIG. 3A. That is, at t=0 the voltage across capacitor 216 is approximately 500 volts, and after t=0 all of ESDs 218-240 are opened. However, FIG. 3B corresponds to a winding insulation resistance of 0.5 megohms, whereas FIG. 3A corresponds to a winding insulation resistance of 2 megohms. As illustrated in FIG. 3B, when ESD 226 is closed at t=5, the substantially instantaneous change in voltage at HV$^+$ and HV$^-$ may be approximately 100 volts. Again, the substantially instantaneous change in voltage occurring at t=5 (i.e., when ESD 226 is closed) is a result of at least the winding insulation resistance of motor 208 being placed in parallel with resistor 212.

FIG. 3B illustrates that if the winding insulation resistance for motor 208 is 0.5 megohms, the substantially instantaneous change in voltage at HV$^+$ and HV$^-$, corresponding to closing ESD 226, may be twice what it is when the motor 208 winding insulation resistance is 2 megohms. Again, since dirt, moisture, physical abrasions, etc. may lower the resistance of the winding insulation, a winding insulation resistance of 0.5 megohms may indicate a fault in the winding insulation, whereas a winding insulation resistance of 2.0 megohms may indicate that the winding insulation is functioning properly. Therefore, the amount of the substantially instantaneous change in voltage corresponding to closing one of ESD 218-228 may be used to determine the structural integrity of the winding insulation within motor 208.

It is contemplated that, as an alternative to engine 202 and generator 204 being used to charge capacitor 216, a direct current (DC) power-producing device (e.g., a battery) may supply power to capacitor 216 to aid in the determination of the structural integrity of the winding insulation. For example, a DC power producing device may be used to apply a first DC voltage (e.g., +250 volts) at HV$^+$ and a second DC voltage (e.g., -250 volts) at HV$^-$. After the DC voltage is applied at HV$^+$ and HV$^-$, an ESD (e.g., ESD 226) may be closed, thus causing a substantially instantaneous change in voltage at HV$^+$ and HV$^-$.

Figure 4:
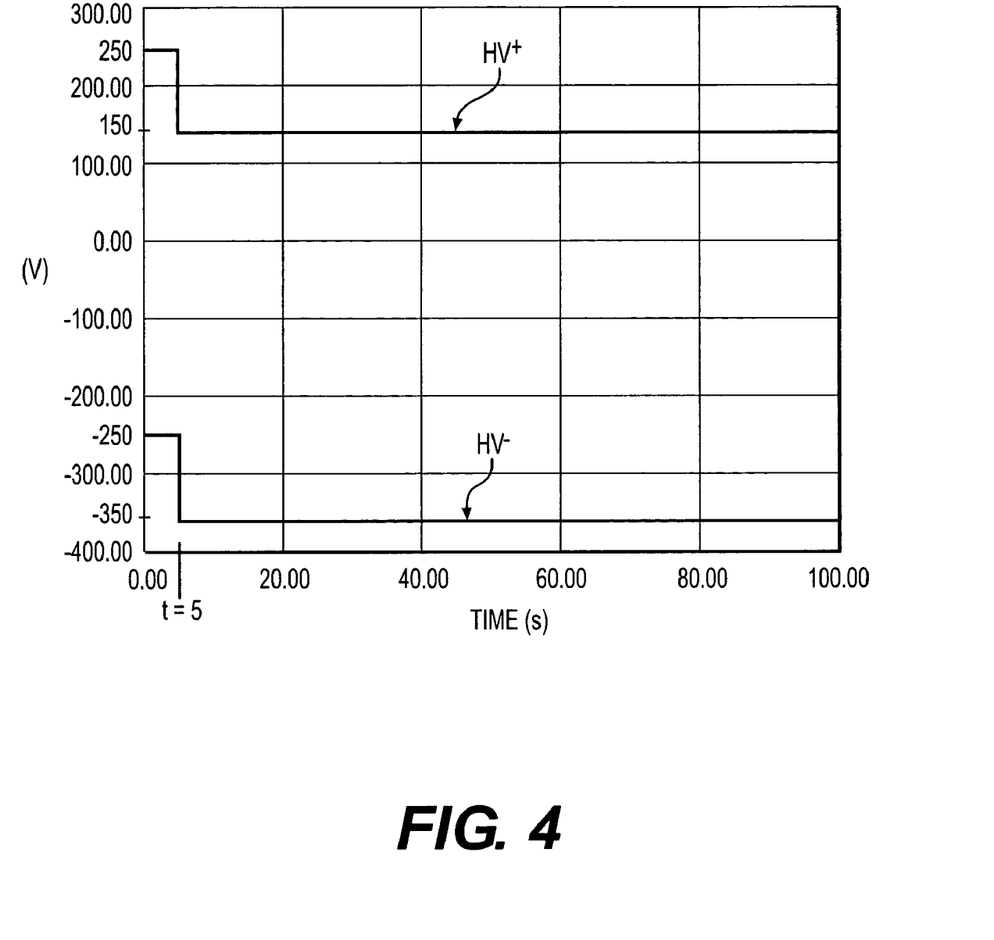
FIG. 4 is an exemplary plot illustrating a substantially instantaneous change in voltage corresponding to a first winding insulation resistance.

Illustrated in FIG. 4 is an exemplary plot showing the substantially instantaneous change in voltage at HV$^+$ and HV$^-$ when ESD 226 is closed at t=5, and when the resistance of the winding insulation is 0.5 megohms. As illustrated in FIG. 4, a winding insulation resistance of 0.5 megohms corresponds to a substantially instantaneous change in voltage at HV$^+$ of approximately 100 volts. Therefore, similar to the method described previously, the substantially instantaneous change in voltage at HV$^+$ (and/or HV$^-$) may be used to determine the structural integrity of the winding insulation.

It is contemplated that the actual resistance of the winding insulation of motor 208 may be calculated using the time constant X (i.e., the discharge rate of capacitor 216). An operator and/or a maintenance technician may then compare the calculated resistance to a threshold resistance value to determine if the winding insulation of motor 208 needs to be replaced. For example, if the calculated resistance is relatively high (i.e., above the threshold resistance value), it may be determined that the winding insulation is operating appropriately. However, if the calculated resistance is relatively low (i.e., below the threshold resistance value), it may be determined that the winding insulation located within motor 208 needs to be replaced or repaired.

It is further contemplated that the structural integrity of the winding insulation associated with generator 204 may be determined substantially similar to the determination of the structural integrity of the winding insulation associated with motor 208. For example, instead of closing ESD 226 at t=5, ESD 238 may be closed at t=5. In this way the structural integrity of the winding insulation associated with generator 204 may be determined through the substantially instantaneous change in voltage at a terminal of capacitor 216 and/or the time constant τ (i.e., the discharge rate of capacitor 216).

INDUSTRIAL APPLICABILITY

The disclosed system and method may be applicable where it is desired to minimize the cost and maximize the reliability of determining the structural integrity of winding insulation in an electric powertrain. The disclosed system and method may minimize the cost and simplify the operation of determining the structural integrity of winding insulation by allowing an operator and/or a maintenance technician to determine the structural integrity of winding insulation using components that are located within the powertrain, rather than connecting a customized circuit to a motor and/or a generator winding. The disclosed system and method may maximize the reliability of determining the structural integrity of winding insulation since few or no additional components are added to the powertrain.

Figure 5:
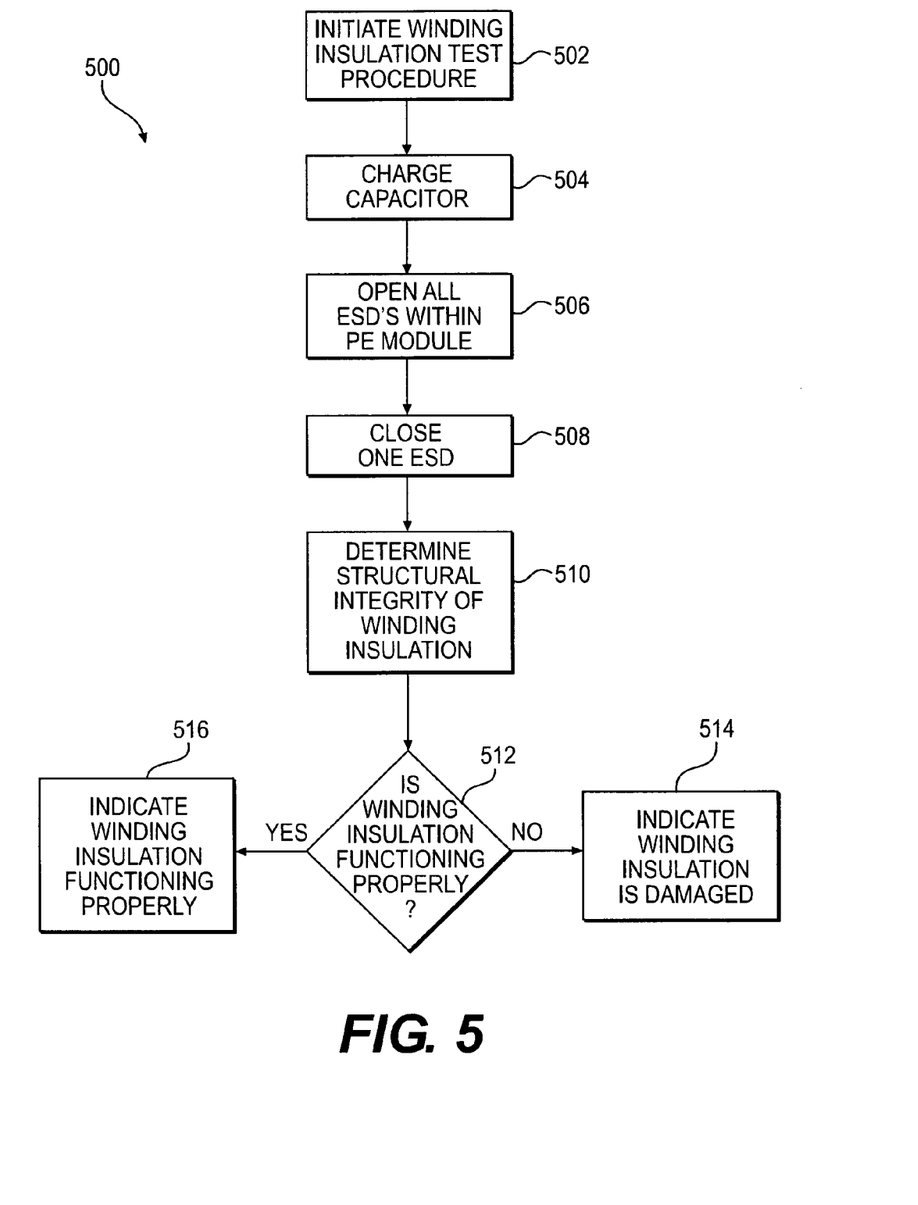
FIG. 5 is an exemplary method for determining the structural and/or electrical integrity of winding insulation associated with the electric powertrain of FIG. 2.

FIG. 5 shows a flowchart 500 illustrating a method for determining the structural integrity of the winding insulation associated with electric powertrain system 200. FIG. 5 will be now be discussed in detail to illustrate the disclosed system and its operation.

As illustrated in flowchart 500, determining the structural integrity of winding insulation associated with electric powertrain system 200 may include initiating a winding insulation test procedure (Step 502). The initiation of the winding insulation test procedure may be done through electronic control module 110 and/or a remote maintenance computing system that may be coupled to electric powertrain system 200. After the winding insulation test procedure has been initiated, capacitor 216 may be charged to a value such as, for example, 500 volts (Step 504). It is contemplated that engine 202 and generator 204 may be used to charge capacitor 216. Once the desired voltage is produced across capacitor 216, all of ESDs 218-240 may be opened (Step 506), ensuring that capacitor 216 is discharging at a rate corresponding to τ=RC, where R corresponds to the resistance of resistor 212 and resistor 214, and C corresponds to the capacitance of capacitor 216. It is contemplated that as a first iteration of the process of flowchart 500, capacitor 216 may be allowed to completely discharge as a calibration process in order to cancel effects of, for example, component degradation, tolerance, and environment. After a calibration discharge cycle, capacitor 216 may be charged again to a desired value (e.g., 500 volts) in preparation for closing one of ESDs 218-240.

Again, once the desired voltage is produced across capacitor 216, all of ESDs 218-240 may be opened (Step 506), ensuring that capacitor 216 is discharging at a rate corresponding to τ=RC, where R corresponds to the resistance of resistor 212 and resistor 214, and C corresponds to the capacitance of capacitor 216. As capacitor 216 discharges, one of ESDs 218-240 may be closed (Step 508). Closing one of ESDs 218-240 may result in introducing the generator 204 or motor 208 winding insulation resistance into PE module 210, thus changing the discharge rate of capacitor 216. According to one embodiment, the user may manually select which of ESDs to switch on, depending upon which one of generator 204 and motor 208 is to be tested. For example, if an operator and/or maintenance technician desires to know the structural integrity of the winding insulation associated with motor 208, then ESD 226 may be closed, thereby allowing electrical current to flow from capacitor 216 to motor 208 (Step 508). If, however, an operator and/or maintenance technician desires to know the structural integrity of the winding insulation associated with generator 204, then ESD 238 may be closed, thus allowing electrical current to flow from capacitor 216 to generator 204 (Step 508).

Once the desired ESD is closed, the resulting substantially instantaneous change in voltage at a terminal of capacitor 216 (i.e., HV$^+$ and/or HV$^-$) may be measured by the voltage measuring device 242. The amount of the substantially instantaneous change in voltage at a terminal of capacitor 216 may be used to determine the structural integrity of a winding insulation within electric powertrain system 200 (Step 510). For example, the winding insulation located within motor 208 may be working properly and may have a relatively high resistance. When ESD 226 is closed, the relatively high resistance of the winding insulation may prevent excess current leakage through a parasitic resistance, thus indicating a properly working winding insulation. Specifically, according to one embodiment, a properly working winding insulation may have a resistance of approximately 2 megohms. When, for example, ESD 226 is closed, the winding insulation resistance of approximately 2 megohms may cause a relatively low substantially instantaneous change in voltage to occur at HV$^+$ and HV$^-$.

Conversely, the resistance associated with a typical damaged winding insulator may be approximately 0.5 megohms. Accordingly, when ESD 226 is closed, the winding insulation having a resistance of approximately 0.5 megohms may cause a relatively high substantially instantaneous change in voltage to occur at HV$^+$ and HV$^-$. Therefore, the amount of the substantially instantaneous change in voltage at a terminal of capacitor 216 may be indicative of the condition of the winding insulation in electric powertrain system 200.

The winding insulation test method may include sending an alert to an operator and/or a maintenance technician in response to the test results. For example, if it is determined that the winding insulation is not working properly (Step 512, No), an alert may be sent to an operator and/or a maintenance technician indicating the winding insulation is damaged (Step 514). However, if it is determined that the structural integrity of the winding insulation is sufficient (Step 512, Yes), then an alert may be sent to an operator and/or a maintenance technician indicating the winding insulation is functioning properly (Step 516). The alerts may be audible alarms (e.g., generated by the alarm 252 shown in FIG. 2), and/or flashing or steady light(s), or by any other appropriate means.

It is contemplated that an operator and/or a maintenance technician may calculate the actual resistance of the winding insulation of generator 204 and/or motor 208 using the time constant τ. An operator and/or maintenance technician may then use the calculated resistance to determine if the winding insulation of generator 204 and/or motor 208 needs to be replaced. For example, if the calculated resistance is relatively high, it may be determined that the winding insulation is operating appropriately. However, if the calculated resistance is relatively low, it may be determined that the winding insulation located within generator 204 and/or motor 208 needs to be replaced. An alert may then be sent to an operator and/or a maintenance technician corresponding to the structural integrity of the winding insulation.

It will be apparent to those skilled in the art that various modifications and variations can be made to the disclosed system and method. Other embodiments will be apparent to those skilled in the art from consideration of the specification and practice of the disclosed system and method. It is intended that the specification and examples be considered as exemplary only, with a true scope being indicated by the following claims and their equivalents.

What is claimed is:

1. A system comprising:
    at least one capacitor;
    a first resistance coupled to the at least one capacitor;
    a plurality of electronic switching devices coupled to at least the first resistance and the at least one capacitor, wherein the plurality of electronic switching devices are configured to couple the at least one capacitor to a power source to charge the at least one capacitor during a first time interval, the plurality of electronic switching devices including a first electronic switching device and at least one second electronic switching device, the first electronic switching device being configured to close to couple the at least one capacitor to a second resistance associated with a winding insulation while the at least one second electronic switching device is open to allow the at least one capacitor to discharge during a second time interval after the first time interval, the plurality of electronic switching devices are configured to control the flow of current from a generator to a motor; and the second resistance corresponds to a resistance of a winding insulation associated with the motor or the generator;
    a voltage measuring device configured to detect a change in voltage at a terminal of the at least one capacitor in response to the closing of the first electronic switching device during the second time interval; and
    a computing system configured to determine a condition of the winding insulation based on the detection.

2. The system of claim 1, wherein the change in voltage detected by the voltage measuring device is a substantially instantaneous change in voltage measured when the first electronic switching device changes from an open configuration to a closed configuration.

3. The system of claim 2, wherein the computing system is further configured to generate an alarm indicative of the substantially instantaneous change in voltage.

4. The system of claim 1, wherein the computing system is further configured to calculate a resistance value associated with the second resistance, compare the resistance value associated with the second resistance to a threshold resistance value, and identify, based on the comparison, a condition of the winding insulation.

5. The system of claim 4, wherein the computing system is further configured to generate an alarm in response to the identified condition of the winding insulation.

6. The system of claim 1, further comprising:
    a power electronics module including the plurality of electronic switching devices, the plurality of electronic switching devices being configured to electronically couple a generator and a motor;
    wherein the computing system is an electronic control module that is configured to at least control the power electronics module during normal operation.

7. The system of claim 1, wherein, during the second time interval, the first electronic switching device and the at least one second electronic switching device are configured to open before the first electronic switching device is closed.

8. A method for determining a condition of a winding insulation, the method comprising:
    controlling a plurality of electronic switching devices to couple at least one capacitor to a power source to charge the at least one capacitor, the plurality of electronic switching devices including a first electronic switching device;
    opening the plurality of electronic switching devices to discharge the at least one charged capacitor;
    closing the first electronic switching device to couple the at least one charged capacitor to a resistance of a winding insulation while the at least one capacitor is discharging the plurality of electronic switching devices electronically couple a generator and a motor; and the resistance includes at least the resistance of a winding insulation associated with the motor or the generator;
    detecting a change in voltage at a terminal of the at least one capacitor in response to the coupling of the at least one capacitor to the resistance; and
    determining, based on the detection, a condition of the winding insulation.

9. The method of claim 8, wherein the change in voltage is substantially instantaneous.

10. The method of claim 9, further including generating an alert, wherein the alert corresponds to the substantially instantaneous change in voltage.

11. The method of claim 8, further including:
    determining a discharge rate of the at least one capacitor after the at least one capacitor is coupled to the resistance; and
    using at least the discharge rate to determine a resistance value associated with the at least one capacitor.

12. The method of claim 11, wherein the winding insulation is associated with a motor or a generator, and the method further includes using at least the resistance value to determine if the winding insulation needs to be replaced.

13. The method of claim 8, wherein closing the electronic switching device changes a discharge rate of the at least one capacitor.

14. The method of claim 8, wherein:
    the plurality of electronic switching devices further includes at least one second electronic switching device; and
    after the plurality of electronic switching devices are opened, the first electronic switching device is closed to couple the at least one charged capacitor to the resistance of the winding insulation while the at least one second electronic switching device remains open.

15. The method of claim 8, wherein the plurality of electronic switching devices electronically couple a generator and a motor, the winding insulation is associated with one of the generator or the motor, and the method further comprises:
    selecting the first electronic switching device of the plurality of electronic switching devices based on whether the winding insulation is associated with the generator or the motor.

16. A system configured to determine a condition of a winding insulation in a machine including a generator configured to supply a flow of current to a motor, the system comprising:
    at least one capacitor;

a DC power producing device configured to be coupled to the at least one capacitor to charge the at least one capacitor;

a first resistance coupled to the at least one capacitor;

a plurality of electronic switching devices coupled to at least the first resistance and the at least one capacitor, and configured to control the flow of current from the generator to the motor, wherein the plurality of electronic switching devices include a first electronic switching device and at least one second electronic switching device, the first electronic switching device being configured to close to couple the at least one capacitor to a second resistance associated with a winding insulation, after the at least one capacitor is charged by the DC power producing device and while the at least one second electronic switching device is open to allow the at least one capacitor to discharge, resulting in a change in voltage at a terminal of the at least one capacitor; and a computing system configured to determine a condition of the winding insulation based on the change in voltage.

17. The system of claim 16, wherein the winding insulation is associated with the motor or the generator.

18. The system of claim 16, wherein the change in voltage is substantially instantaneous.

* * * * *